(12) United States Patent
Chen et al.

(10) Patent No.: US 9,960,231 B2
(45) Date of Patent: May 1, 2018

(54) STANDARD CELL ARCHITECTURE FOR PARASITIC RESISTANCE REDUCTION

(71) Applicant: QUALCOMM Incorporated, San Diego, CA (US)

(72) Inventors: Xiangdong Chen, San Diego, CA (US); Hyeokjin Bruce Lim, San Diego, CA (US); Satyanarayana Sahu, San Diego, CA (US); Venugopal Boynapalli, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/186,326

(22) Filed: Jun. 17, 2016

(65) Prior Publication Data

US 2017/0365657 A1  Dec. 21, 2017

(51) Int. Cl.
 H01L 21/82 (2006.01)
 H01L 29/06 (2006.01)
 H01L 23/535 (2006.01)
 H01L 27/02 (2006.01)
 H01L 23/528 (2006.01)
 H01L 27/118 (2006.01)

(52) U.S. Cl.
 CPC ........ *H01L 29/0646* (2013.01); *H01L 23/528* (2013.01); *H01L 23/535* (2013.01); *H01L 27/0207* (2013.01); *H01L 27/11807* (2013.01); *H01L 2027/11875* (2013.01)

(58) Field of Classification Search
 CPC ............. H01L 29/0646; H01L 29/0649; H01L 23/535; H01L 27/0207; G06F 17/5072; G06F 17/5068
 See application file for complete search history.

(56) References Cited

U.S. PATENT DOCUMENTS 7,240,314 B1  7/2007  Leung
8,173,491 B2  5/2012  Law et al.
8,756,550 B2  6/2014  Blatchford
(Continued)

OTHER PUBLICATIONS

Du Y., et al., "Optimization of Standard Cell Based Detailed Placement for 16 nm FinFET Process," Design, Automation and Test in Europe Conference and Exhibition (DATE), IEEE, Mar. 2014, pp. 1-6.
(Continued)

*Primary Examiner* — Syed Gheyas
(74) *Attorney, Agent, or Firm* — Arent Fox LLP (57) ABSTRACT

A MOS IC may include a first contact interconnect in a first standard cell that extends in a first direction and contacts a first MOS transistor source and a voltage source. Still further, the MOS IC may include a first double diffusion break extending along a first boundary in the first direction of the first standard cell and a second standard cell. The MOS IC may also include a second contact interconnect extending over a portion of the first double diffusion break. In an aspect, the second contact interconnect may be within both the first standard cell and the second standard cell and coupled to the voltage source. Additionally, the MOS IC may include a third contact interconnect extending in a second direction orthogonal to the first direction and couples the first contact interconnect and the second contact interconnect together.

20 Claims, 8 Drawing Sheets

(56) References Cited

U.S. PATENT DOCUMENTS

| | | |
|---|---|---|
| 8,881,083 B1 | 11/2014 | Deng et al. |
| 9,123,565 B2 | 9/2015 | Lu et al. |
| 2009/0026503 A1 | 1/2009 | Tsuda |
| 2015/0303216 A1 | 10/2015 | Tamaru et al. |
| 2016/0117431 A1* | 4/2016 | Kim .................... G06F 17/5072 716/119 |
| 2017/0154848 A1* | 6/2017 | Fan ................... H01L 21/76805 |

OTHER PUBLICATIONS

International Search Report and Written Opinion—PCT/US2017/036865—ISA/EPO—Sep. 26, 2017.

* cited by examiner

STANDARD CELL ARCHITECTURE FOR PARASITIC RESISTANCE REDUCTION

BACKGROUND

Field

The present disclosure relates generally to a standard cell architecture, and more particularly, to a standard cell architecture for a metal oxide semiconductor (MOS) integrated circuit (IC) device that reduces parasitic resistance.

Background

Standard cells of an integrated circuit implement digital logic. An application-specific integrated circuit (ASIC), such as a system-on-a-chip (SoC) device, may contain thousands to millions of standard cell devices. A typical MOS IC device includes a stack of sequentially formed layers. Each layer may be stacked or overlaid on a prior layer and patterned to form the shapes that define transistors (e.g., field effect transistors (FETs) and/or a fin-shaped FET (Fin-FET)) and connect the transistors into circuits.

As MOS IC devices are fabricated at smaller sizes, manufacturers are finding it more difficult to integrate larger amounts of standard cell devices on a single chip. For example, as the size of MOS IC devices are reduced, the area penalty caused by the double diffusion break used to isolate adjacent standard cells may become too great. In addition, an increase in parasitic resistance may be caused by the reduction in the width and thickness of various layers of the MOS IC device. The increase in parasitic resistance may be responsible for a delay of standard cell output.

Accordingly, there is an unmet need for a standard cell architecture that is able to utilize the area of the double diffusion break and reduce the parasitic resistance of smaller MOS IC devices.

SUMMARY

In an aspect of the disclosure, a MOS IC may include a first standard cell and a second standard cell adjacent the first standard cell. The MOS IC may also include a first MOS transistor in the first standard cell. In an aspect, the first MOS transistor may have a first MOS transistor source. In addition, the MOS IC may include a first contact interconnect extending in a first direction and contacting the first MOS transistor source. In an aspect, the first contact interconnect may be within the first standard cell. In another aspect, the first contact interconnect may be coupled to a voltage source. Still further, the MOS IC may include a first double diffusion break extending along a first boundary in the first direction of the first standard cell and the second standard cell. In an aspect, the first double diffusion break may be within both the first standard cell and the second standard cell. The MOS IC may also include a second contact interconnect extending in the first direction along the first boundary and over a portion of the first double diffusion break. In an aspect, the second contact interconnect may be within both the first standard cell and the second standard cell. In another aspect, the second contact interconnect may be coupled to the voltage source. Additionally, the MOS IC may include a third contact interconnect extending in a second direction orthogonal to the first direction and contacting the first contact interconnect and the second contact interconnect to couple the first contact interconnect and the second contact interconnect together.

In another aspect of the disclosure, a method of operation of a MOS IC including a first standard cell and a second standard cell adjacent the first standard cell may include flowing a first current through a first MOS transistor in the first standard cell. In an aspect, the first MOS transistor has a first MOS transistor source. The method may also include flowing a second current through a first contact interconnect extending in a first direction and contacting the first MOS transistor source. In one aspect, the first contact interconnect is within the first standard cell. In another aspect, the first contact interconnect is coupled to a voltage source. The method may further include flowing a third current through a second contact interconnect extending in the first direction along a first boundary and over a portion of a first double diffusion break that extends along the first boundary in the first direction of the first standard cell and the second standard cell. In an aspect, the first double diffusion break is within both the first standard cell and the second standard cell. In another aspect, the second contact interconnect is within both the first standard cell and the second standard cell. In a further aspect, the second contact interconnect is coupled to the voltage source. The method may additionally include flowing a fourth current through a third contact interconnect extending in a second direction orthogonal to the first direction and contacting the first contact interconnect and the second contact interconnect to couple the first contact interconnect and the second contact interconnect together.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

As SoC devices are fabricated at smaller sizes, manufacturers are finding it more difficult to integrate larger amounts of standard cell devices on a single chip. For example, as the size of SoC devices are reduced, an increase in parasitic resistance is caused by the reduction in the widths and thicknesses of the various layers of the SoC device. The increase in parasitic resistance may be responsible for a delay of standard cell output.

Figure 1:
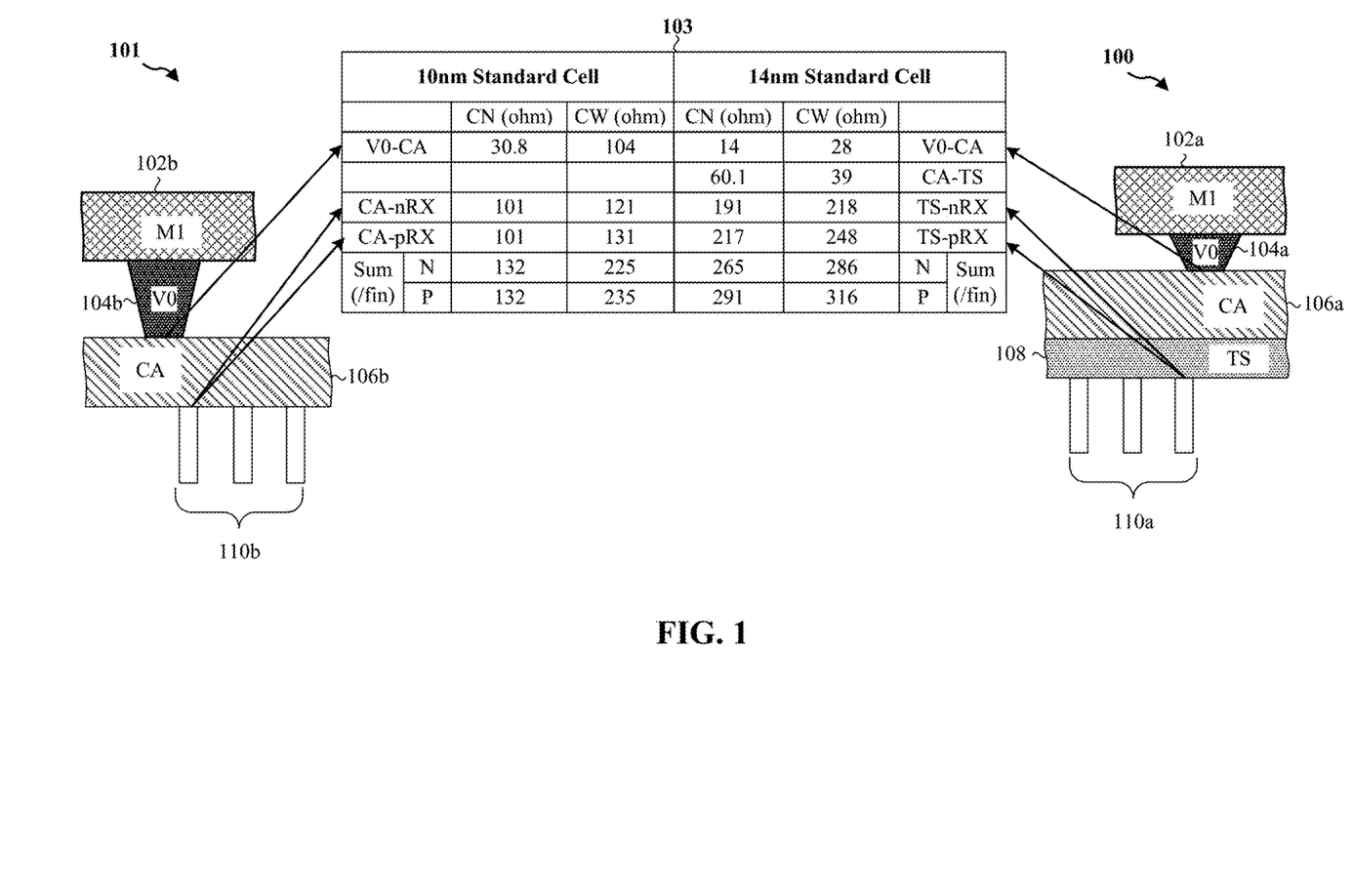
FIG. 1 is a diagram illustrating a cross-sectional view of an example MOS IC device and a table illustrating a correlation between parasitic resistance and the size of the MOS IC device.

FIG. 1 is a diagram illustrating a cross-sectional view of a 14 nm standard cell 100 and a 10 nm standard cell 101. In addition, FIG. 1 includes a table 103 that compares resistances in each of 10 nm standard cell 101 and the 14 nm standard cell 100.

For example, the 14 nm standard cell 100 illustrated in FIG. 1 includes an M1 layer interconnect 102a, a via (via V0) 104a, a metal diffusion contact A (CA) interconnect 106a, a trench silicide (TS) interconnect 108, and a plurality of fins 110a. As depicted in the table 103, the parasitic resistance caused by the via V0 104a and the CA interconnect 106a in the 14 nm standard cell 100 is at a worst case scenario 28 ohm.

The 10 nm standard cell 101 illustrated in FIG. 1 includes an M1 layer interconnect 102b, a via V0 104b, a CA interconnect 106b, and a plurality of fins 110b. As depicted in the table 103, the parasitic resistance caused by the via V0 104b and the CA interconnect 106b in the 10 nm standard cell 101 is at a worst case scenario 104 ohm. That is, as the size of that standard cells are manufactured decreases from 14 nm to 10 nm, the parasitic resistance of the via V0 and the CA interconnect increases by nearly a factor of four.

Figure 2:
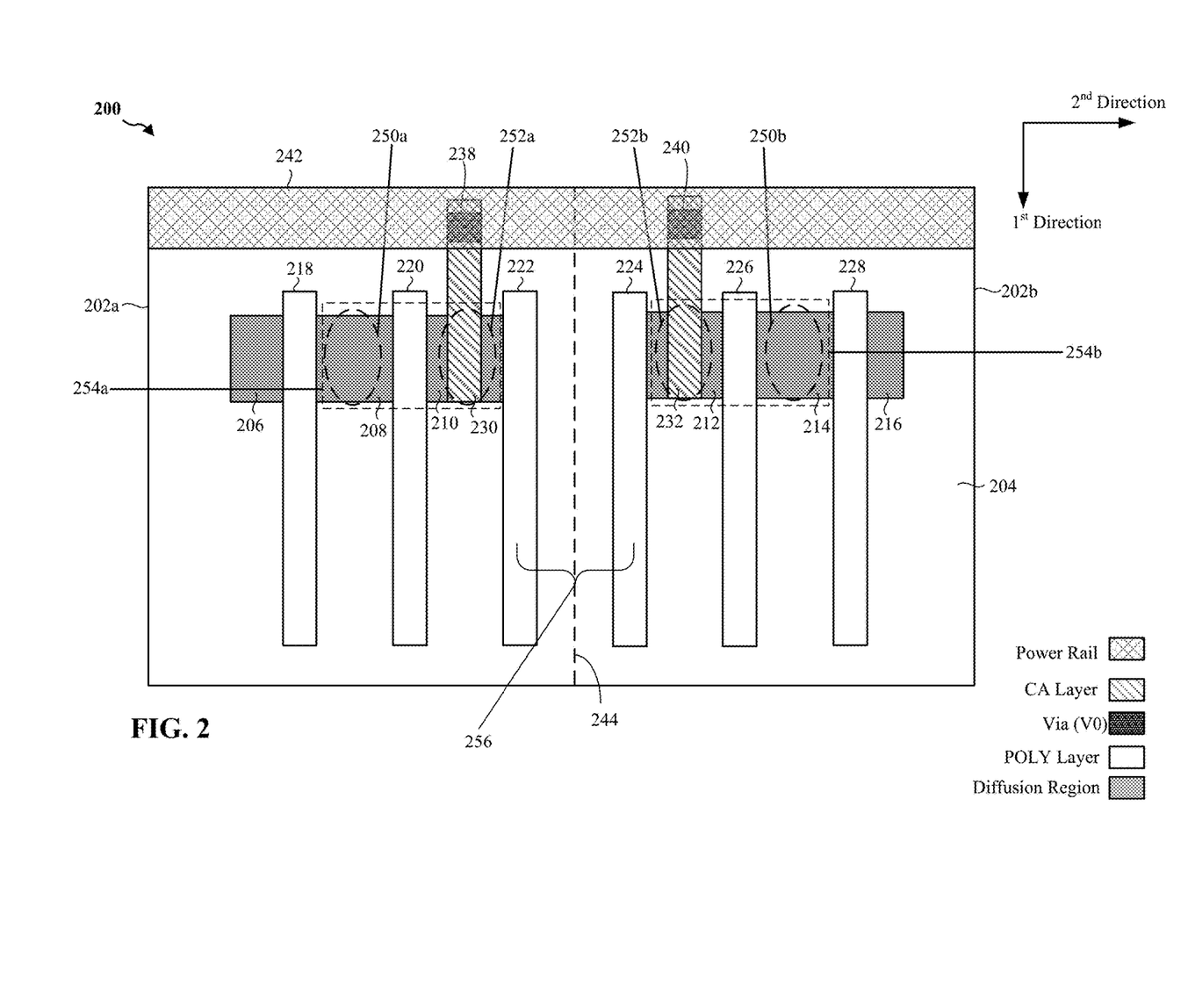
FIG. 2 is a diagram illustrating a plan view of an example MOS IC device.

FIG. 2 is an example diagram illustrating a plan view of an example MOS IC device 200 including a first standard cell 202a and a second standard cell 202b formed on substrate 204 (e.g., silicon substrate). The first standard cell 202a and the second standard cell 202b share a cell boundary 244. It should be understood that the example diagram of FIG. 2 is a representation of the various masks that may be used for fabricating the features of the MOS IC device 200. For example, each mask may correspond to various features that are to be configured in a particular layer (e.g., interconnects, vias, etc.) of the MOS IC device 200. Therefore, the example diagram illustrated in FIG. 2 concurrently shows a number of layers of the MOS IC device 200 in an overlaid manner for ease of illustration and understanding of the disclosure.

In the example configuration of FIG. 2, the first standard cell 202a includes diffusion regions 206, 208, and 210, and the second standard cell 202b includes diffusion regions 212, 214, and 216. For example, the diffusion regions 206, 208, 210, 212, 214, and 216 may be p-type diffusion regions or n-type diffusion regions. In addition, the first standard cell 202a includes gate interconnects 218, 220, and 222. The second standard cell 202b includes gate interconnects 224, 226, and 228. In one aspect, each of the gate interconnects 218, 220, 222, 224, 226, and 228 may be configured in a POLY layer. In some process technologies, the gate interconnects 218, 220, 222, 224, 226, and 228 may be formed of metal. However, in other process technologies, the gate interconnects 218, 220, 222, 224, 226, and 228 may be entirely polysilicon or may be polysilicon with a metal top layer. As indicated in the top right corner of FIG. 2, the gate interconnects 218, 220, 222, 224, 226, and 228 extend in a first direction.

Furthermore, gate interconnects 222 and 224 are configured as dummy gate interconnects. A dummy gate interconnect may refer to a gate interconnect that is not configured as a transistor gate for a transistor (e.g., the fins between the dummy gate interconnects 222 and 224 are cut). In addition, to electrically isolate the first standard cell 202a and the second standard cell 202b, a double diffusion break 256 may be formed between dummy gate interconnects 222 and 224 and across the cell boundary 244. The double diffusion break 256 includes a first half portion of the double diffusion break in the first standard cell 202a and a second half portion of the double diffusion break in the second standard cell 202b. For example, the double diffusion break 256 may include an isolation trench (e.g., a shallow trench isolation (STI) region) formed in the substrate 204 between dummy gate interconnects 222 and 224. In an aspect, the double diffusion break 256 may include an isolation trench that extends partially under each of the dummy gate interconnects 222 and 224.

In the example configuration of FIG. 2, the gate interconnects 218, 220, 226, and 228 are configured as transistor gates. For example, gate interconnect 220 is configured as transistor gate for a first transistor 254a located in the first standard cell 202a. The gate interconnect 226 is configured as a transistor gate for a second transistor 254b located in the second standard cell 202b. The first transistor 254a located in the first standard cell 254a includes a first source 252a and a first drain 250a. The second transistor 254b located in the second standard cell 254b includes a second source 252b and a second drain 250b.

In an aspect, the first source 252a includes a first CA interconnect 230 and a first via V0 238 that connect the first transistor 254a to the power rail 242. In addition, the second source 252b includes a second CA interconnect 232 and a second via V0 240 that connect the second transistor 254b to the power rail 242. The first CA interconnect 230 and the second CA interconnect 232 each extend in a first direction as indicated in the top right corner of FIG. 2. The power rail 242 extends in a second direction as indicated in the top right corner of FIG. 2.

As the size of MOS IC devices decreases, the area required for a double diffusion break may introduce an undesirable area penalty and the increased parasitic resistance may cause an undesirable delay of standard cell output. Accordingly, there is an unmet need for a standard cell architecture that is able to utilize the area of the double diffusion break and reduce the parasitic resistance of smaller MOS IC devices.

Figure 3A:
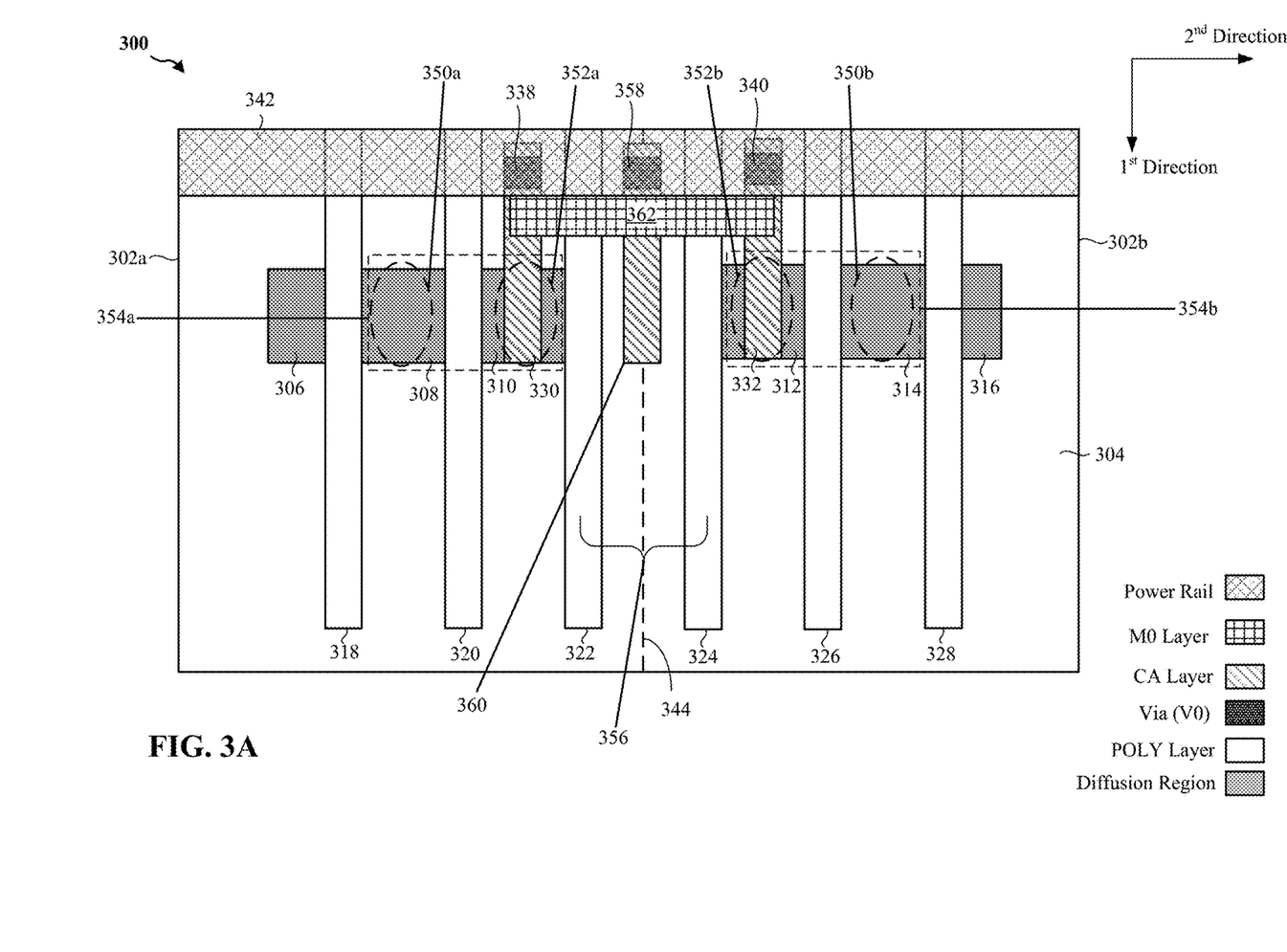
FIG. 3A is a diagram illustrating a plan view of an exemplary MOS IC device with a standard cell architecture that reduces parasitic resistance.

FIG. 3A is a diagram illustrating a plan view of an exemplary MOS IC device 300 that is configured with a standard cell architecture that reduces parasitic resistance. For example, the MOS IC device 300 includes a first standard cell 302a and a second standard cell 302b formed on substrate 304 (e.g., silicon substrate). The first standard cell 302a and the second standard cell 302b share a cell boundary 344. It should be understood that the diagram is a representation of the various masks that may be used for fabricating the features of the MOS IC device 300. For example, each mask may correspond to various features that are to be configured in a particular layer (e.g., interconnects, vias, etc.) of the MOS IC device 300. Therefore, the diagram illustrated in FIG. 3A concurrently shows a number of layers of the MOS IC device 300 in an overlaid manner for ease of illustration and understanding of the disclosure.

In the example configuration of FIG. 3A, the first standard cell 302a includes diffusion regions 306, 308, and 310, and the second standard cell 302b includes diffusion regions 312, 314, and 316. For example, the diffusion regions 306, 308, 310, 312, 314, and 316 may be p-type diffusion regions or n-type diffusion regions. In addition, the first standard cell 302a includes gate interconnects 318, 320, and 322. The second standard cell 302b includes gate interconnects 324, 326, and 328. In one aspect, each of the gate interconnects 318, 320, 322, 324, 326, and 328 may be configured in a POLY layer. In some process technologies, the gate interconnects 318, 320, 322, 324, 326, and 328 may be formed of metal. However, in other process technologies, the gate interconnects 318, 320, 322, 324, 326, and 328 may be entirely polysilicon or may be polysilicon with a metal top layer. As indicated in the top right corner of FIG. 3A, the gate interconnects 318, 320, 322, 324, 326, and 328 extend in a first direction.

Furthermore, gate interconnects 322 and 324 are configured as dummy gate interconnects. A dummy gate interconnect may refer to a gate interconnect that is not configured as a transistor gate for a transistor (e.g., the fins between the dummy gate interconnects 322 and 324 are cut). In addition, to electrically isolate the first standard cell 302a and the second standard cell 302b, a double diffusion break 356 may be formed between dummy gate interconnects 322 and 324 and across the cell boundary 344. The double diffusion break 356 includes a first half portion of the double diffusion break in the first standard cell 302a and a second half portion of the double diffusion break in the second standard cell 302b. For example, the double diffusion break 356 may include an isolation trench (e.g., an STI region) formed in the substrate 304 between dummy gate interconnects 322 and 324. In an aspect, the double diffusion break 356 may include an isolation trench that extends partially under each of the dummy gate interconnects 322 and 324.

In the exemplary configuration of FIG. 3A, the gate interconnects 318, 320, 326, and 328 are configured as transistor gates. For example, gate interconnect 320 is configured as transistor gate for a first transistor 354a located in the first standard cell 302a. The gate interconnect 326 is configured as a transistor gate for a second transistor 354b located in the second standard cell 302b. The first transistor 354a located in the first standard cell 302a includes a first source 352a and a first drain 350a. The second transistor 354b located in the second standard cell 302b includes a second source 352b and a second drain 350b.

In an aspect, the first source 352a is contacted by a first CA interconnect 330 and a first via V0 338 that connect the first transistor 354a to the power rail 342. In addition, the second source 352b is contacted by a second CA interconnect 332 and a second via V0 340 that connect the second transistor 354b to the power rail 342.

In the exemplary configuration of FIG. 3A, a third CA interconnect 360 and a third via V0 358 are formed over the cell boundary 344 and the double diffusion break 356. Still further, a metal zero (M0) layer interconnect 362 (e.g., a metal layer or a metal oxide layer) is formed connecting each of the first CA interconnect 330, the second CA interconnect 332, and the third CA interconnect 360 in parallel to the power rail 342. The M0 layer interconnect 362 may be floating such that the M0 layer interconnect 362 does not make contact with the dummy gate interconnects 322 and 324. Alternatively, the M0 layer interconnect 362 may contact and short to the dummy gate interconnects 322 and 324 by directly contacting the dummy gate interconnect or via a metal POLY contact B (CB) interconnect (not illustrated in FIG. 3A) formed on the dummy gate interconnects 322 and 324.

By connecting each of the first CA interconnect 330, the second CA interconnect 332, and the third CA interconnect 360 in parallel to the power rail 342, the parasitic resistance of the first transistor 354a and the second transistor 354b may each be reduced by approximately a factor of three. The total parasitic resistance of the first transistor 354a and the second transistor 354b may be reduced by a factor of three because the first transistor 354a and the second transistor 354b each have three different electrical paths to the power rail 342 in the exemplary standard cell architecture illustrated in FIG. 3A. Additional details of the three different electrical paths from the first transistor 354a is discussed infra with respect to FIG. 3B.

The first CA interconnect 330, the second CA interconnect 332, and the third CA interconnect 360 each extend in a first direction as indicated in the top right corner of FIG. 3A. The power rail 342 and the M0 layer interconnect 362 each extend in a second direction as indicated in the top right corner of FIG. 3A.

Figure 3B:
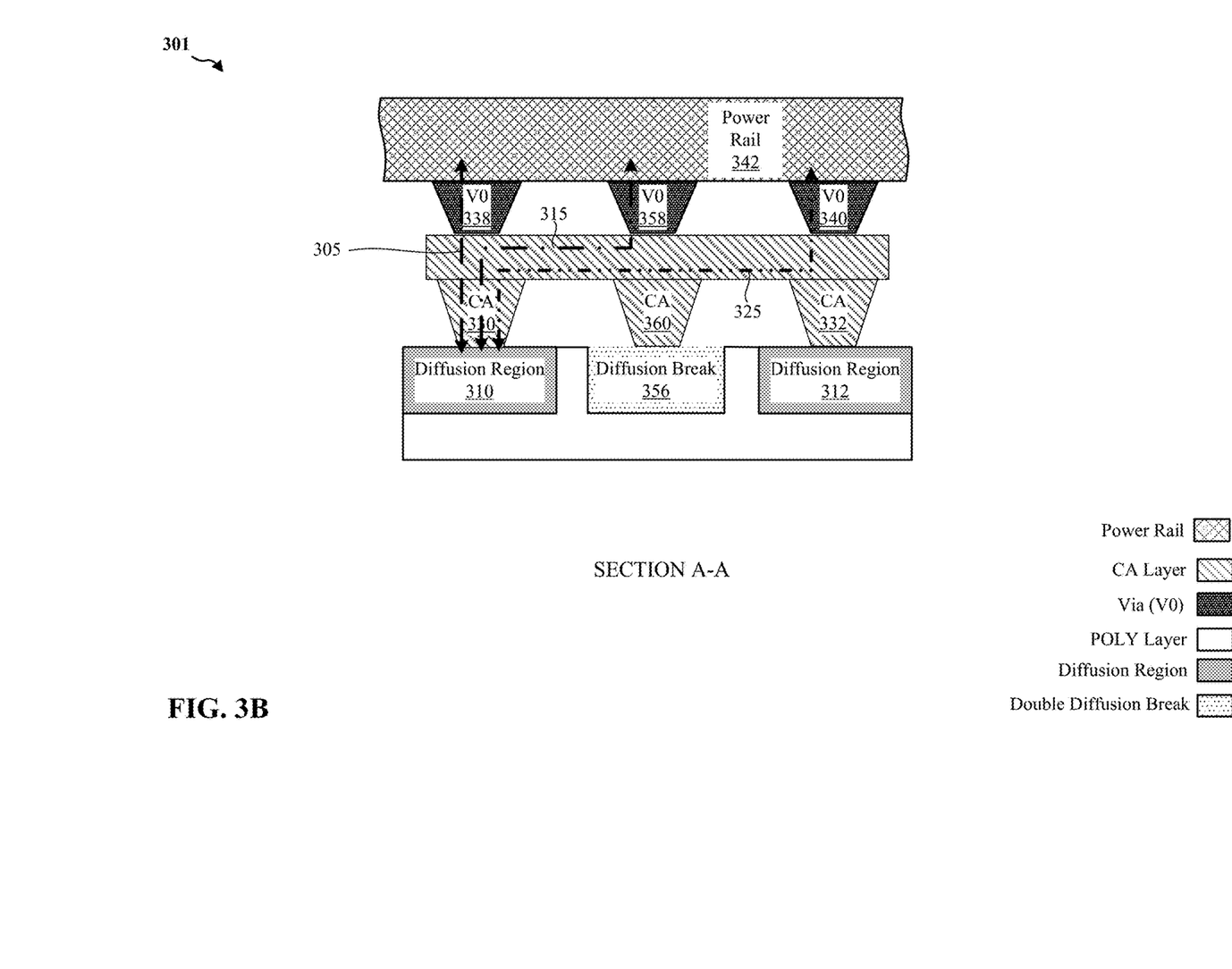
FIG. 3B is a symbolic diagram illustrating a cross-sectional view of the exemplary MOS IC device with the standard cell architecture illustrated in FIG. 3A.

FIG. 3B is a diagram of a cross-sectional view of an exemplary MOS IC device 301 that symbolically illustrates each of the three electrical paths from the first transistor 354a (illustrated in FIG. 3A) to the power rail 342. For simplicity, the M0 layer interconnect 362 illustrated in FIG. 3A is not shown in FIG. 3B. Instead, FIG. 3B symbolically illustrates the electrical connection provided by the M0 layer interconnect 362 as a physical connection of the first CA interconnect 330, the second CA interconnect 332, and the third CA interconnect 360.

As illustrated in FIG. 3B, the first transistor 354a (illustrated in FIG. 3A) is connected to the power rail 342 through a first electrical path 305 between the diffusion region 310, the first CA interconnect 330, and the first via V0 338. The first transistor 354a is also connected to the power rail 342 through a second electrical path 315 between the diffusion region 310, the first CA interconnect 330, and third via V0 358. Still further, the first transistor 354a is connected to the power rail 342 through a third electrical path 325 between the diffusion region 310, the first CA interconnect 330, and the second via V0 340. Although not illustrated for simplicity, it should is understood that similar electrical paths exist for the second transistor 354b.

By connecting the first CA interconnect 330, the second CA interconnect 332, and the third CA interconnect 360 in parallel, the standard cell architecture of FIGS. 3A and 3B is able to utilize the area over the double diffusion break 356 and reduce the total parasitic resistance of the first transistor 354a and the second transistor 354b by approximately a factor of three.

Figure 4A:
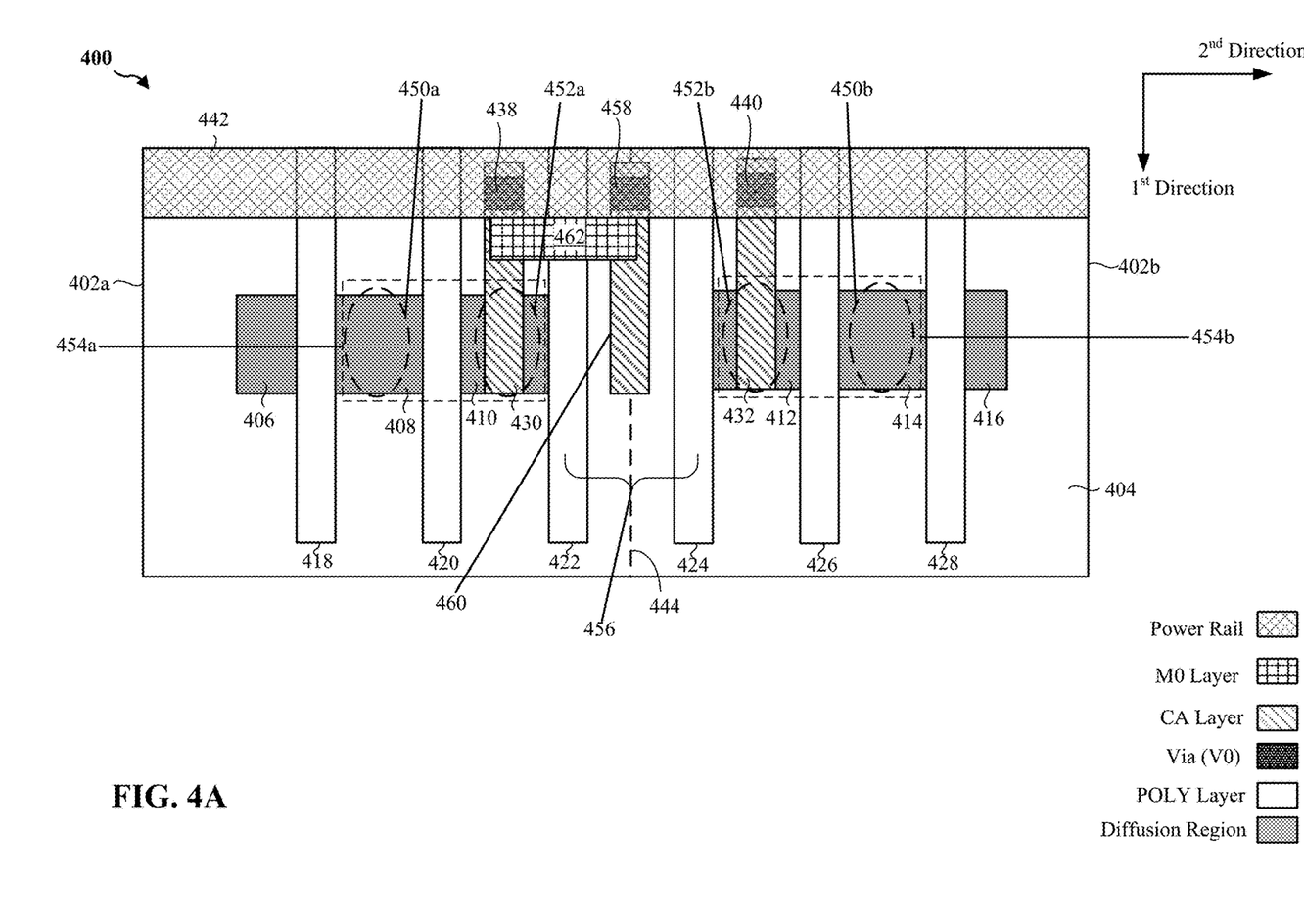
FIG. 4A is a diagram illustrating a plan view of an exemplary MOS IC device with a standard cell architecture that reduces parasitic resistance.

FIG. 4A is a diagram illustrating a plan view of an exemplary MOS IC device 400 that is configured with a standard cell architecture that reduces parasitic resistance. For example, the MOS IC device 400 includes a first standard cell 402a and a second standard cell 402b formed on substrate 404 (e.g., silicon substrate). The first standard cell 402a and the second standard cell 402b share a cell boundary 444. It should be understood that the diagram is a representation of the various masks that may be used for fabricating the features of the MOS IC device 400. For example, each mask may correspond to various features that are to be configured in a particular layer (e.g., interconnects, vias, etc.) of the MOS IC device 400. Therefore, the diagram illustrated in FIG. 4A concurrently shows a number of layers of the MOS IC device 400 in an overlaid manner for ease of illustration and understanding of the disclosure.

In the example configuration of FIG. 4A, the first standard cell 402a includes diffusion regions 406, 408, and 410, and the second standard cell 402b includes diffusion regions 412, 414, and 416. For example, the diffusion regions 406, 408, 410, 412, 414, and 416 may be p-type diffusion regions or n-type diffusion regions. In addition, the first standard cell 402a includes gate interconnects 418, 420, and 422. The second standard cell 402b includes gate interconnects 424, 426, and 428. In one aspect, each of the gate interconnects 418, 420, 422, 424, 426, and 428 may be configured in a POLY layer. In some process technologies, the gate interconnects 418, 420, 422, 424, 426, and 428 may be formed of metal. However, in other process technologies, the gate interconnects 418, 420, 422, 424, 426, and 428 may be entirely polysilicon or may be polysilicon with a metal top layer. As indicated in the top right corner of FIG. 4A, the gate interconnects 418, 420, 422, 424, 426, and 428 extend in a first direction.

Furthermore, gate interconnects 422 and 424 are configured as dummy gate interconnects. A dummy gate interconnect may refer to a gate interconnect that is not configured as a transistor gate for a transistor (e.g., the fins between the dummy gate interconnects 422 and 424 are cut). In addition, to electrically isolate the first standard cell 402a and the second standard cell 402b, a double diffusion break 456 may be formed between dummy gate interconnects 422 and 424 and across the cell boundary 444. The double diffusion break 456 includes a first half portion of the double diffusion break in the first standard cell 402a and a second half portion of the double diffusion break in the second standard cell 402b. For example, the double diffusion break 456 may include an isolation trench (e.g., an STI region) formed in the substrate 404 between dummy gate interconnects 422 and 424. In an aspect, the double diffusion break 456 may include an isolation trench that extends partially under each of the dummy gate interconnects 422 and 424.

In the exemplary configuration of FIG. 4A, the gate interconnects 418, 420, 426, and 428 may be configured as transistor gates. For example, gate interconnect 420 is configured as transistor gate for a first transistor 454a located in the first standard cell 402a. The gate interconnect 426 is configured as a transistor gate for a second transistor 454b located in the second standard cell 402b. The first transistor 454a located in the first standard cell 402a includes a first source 452a and a first drain 450a. The second transistor 454b located in the second standard cell 402b includes a second source 452b and a second drain 450b.

In an aspect, the first source 452a contacts a first CA interconnect 430 and a first via V0 438 that connect the first transistor 454a to the power rail 442. In addition, the second source 452b contacts a second CA interconnect 432 and a second via V0 440 that connect the second transistor 454b to the power rail 442.

In the exemplary configuration of FIG. 4A, a third CA interconnect 460 and a third via V0 458 are formed over the cell boundary 444 and the double diffusion break 456. Still further, an M0 layer interconnect 462 (e.g., a metal layer or a metal oxide layer) is formed connecting the first CA interconnect 430 and the third CA interconnect 460 in parallel to the power rail 442. The M0 layer interconnect 462 may be floating such that the M0 layer interconnect 462 does not make contact with the dummy gate interconnect 422. Alternatively, the M0 layer interconnect 462 may contact and short to the dummy gate interconnect 422 by directly contacting the dummy gate interconnect or via a CB interconnect (not illustrated in FIG. 4A) formed on the dummy gate interconnect 422.

By connecting the first CA interconnect 430 and the third CA interconnect 460 in parallel to the power rail 442, the parasitic resistance of the first transistor 454a may be reduced by approximately a factor of two. The parasitic resistance of the first transistor 454a may be reduced by a factor of two because the first transistor 454a has two different electrical paths to the power rail 442 in the exemplary standard cell architecture illustrated in FIG. 4A. Additional details of the two different electrical paths from the first transistor 454a is discussed infra with respect to FIG. 4B.

The first CA interconnect 430, the second CA interconnect 432, and the third CA interconnect 460 each extend in a first direction as indicated in the top right corner of FIG. 4A. The power rail 442 and the M0 layer interconnect 462 each extend in a second direction as indicated in the top right corner of FIG. 4A.

Figure 4B:
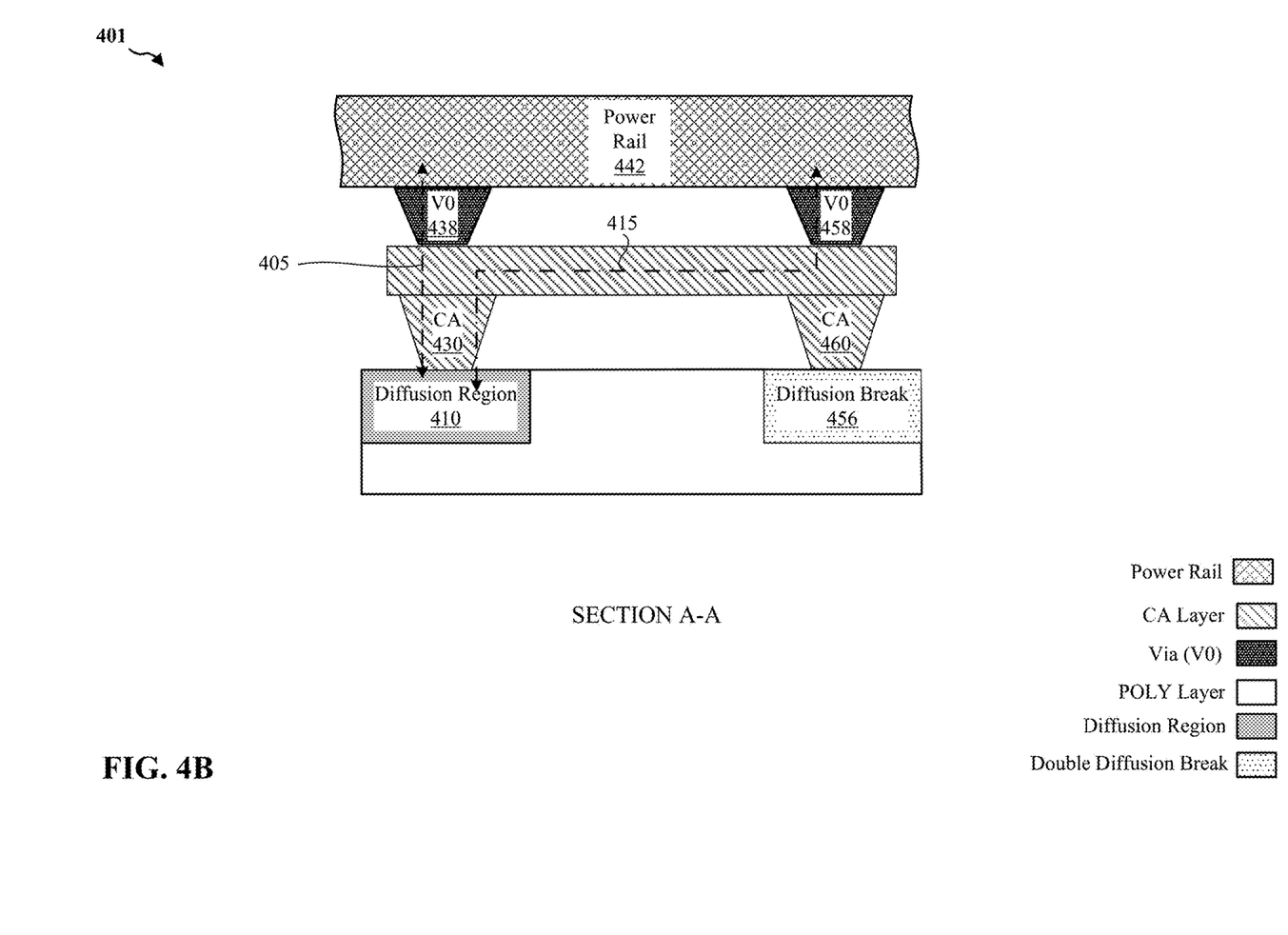
FIG. 4B is a symbolic diagram illustrating a cross-sectional view of the exemplary MOS IC device with the standard cell architecture illustrated in FIG. 4A.

FIG. 4B is a diagram of a cross-sectional view of an exemplary MOS device IC 401 that symbolically illustrates each of the two electrical paths from the first transistor 454a (illustrated in FIG. 4A) to the power rail 442. For simplicity, the M0 layer interconnect 462 illustrated in FIG. 4A is not shown in FIG. 4B. Instead, FIG. 4B symbolically illustrates the electrical connection provided by the M0 layer interconnect 462 as a physical connection of the first CA interconnect 430 and the third CA interconnect 460.

As illustrated in FIG. 4B, the first transistor 454a (illustrated in FIG. 4A) is connected to the power rail 442 through a first electrical path 405 between the diffusion region 410, the first CA interconnect 430, and the first via V0 438. The first transistor 454a is also connected to the power rail 442 through a second electrical path 415 between the diffusion region 410, the first CA interconnect 430, and third via V0 458.

By connecting the first CA interconnect 430 and the third CA interconnect 460 in parallel, the standard cell architecture of FIGS. 4A and 4B is able to utilize the area over the double diffusion break 456 and reduce the parasitic resistance of the first transistor 454a by approximately a factor of two.

Figure 5:
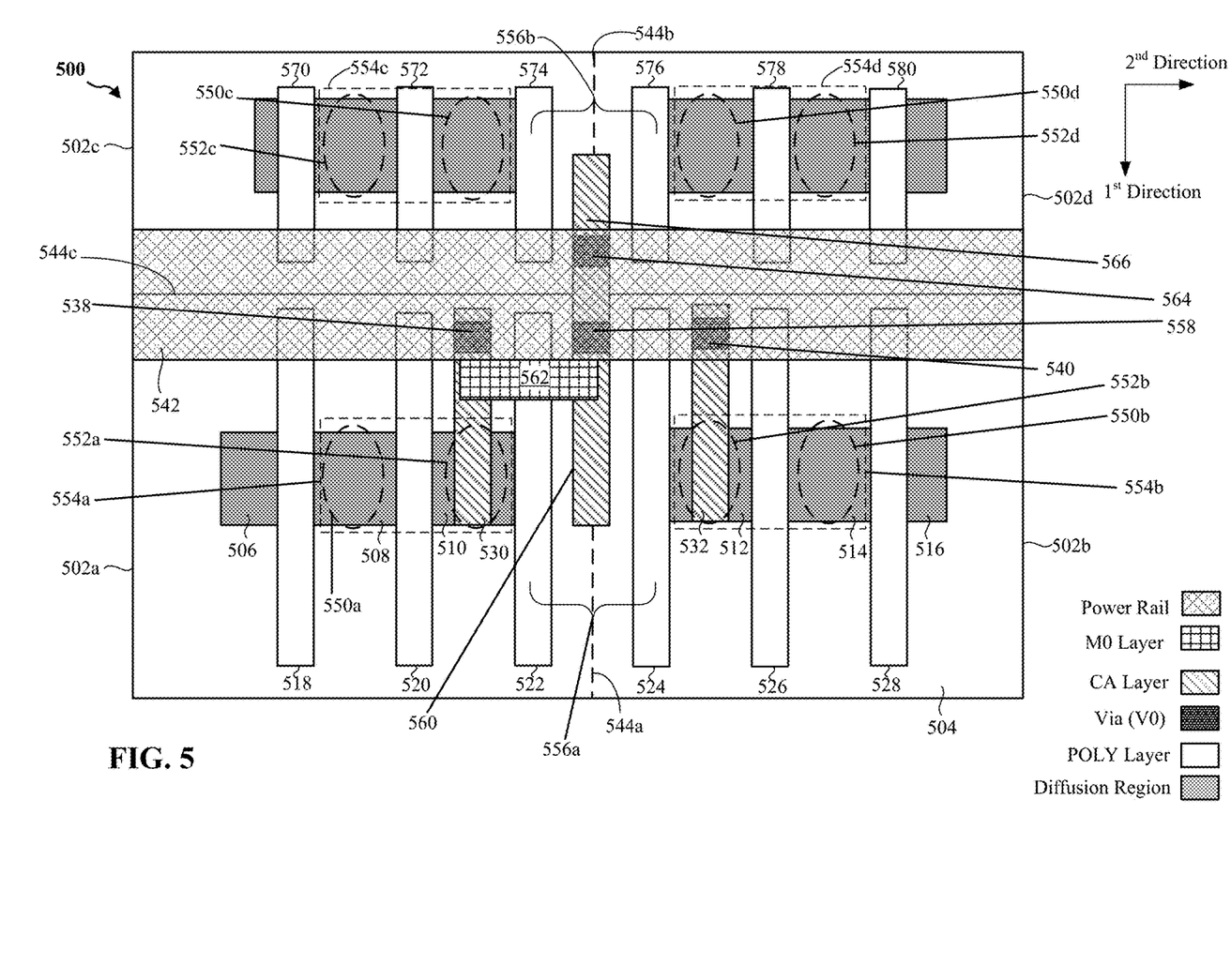
FIG. 5 is a diagram illustrating a plan view of an exemplary MOS IC device with a standard cell architecture that reduces parasitic resistance.

FIG. 5 is a diagram illustrating a plan view of an exemplary MOS IC device 500 that is configured with a standard cell architecture that reduces parasitic resistance. For example, the MOS IC device 500 includes a first standard cell 502a, a second standard cell 502b, a third standard cell 502c, and a fourth standard cell 502d formed on substrate 504 (e.g., silicon substrate). The first standard cell 502a and the second standard cell 502b share a first cell boundary 544a. The third standard cell 502c and the fourth standard cell 502d share a second cell boundary 544b. In addition, the first standard cell 502a and the second standard cell 502b share an abutment boundary 544c with the third standard cell 502c and the fourth standard cell 502d. It should be understood that the diagram is a representation of the various masks that may be used for fabricating the features of the MOS IC device 500. For example, each mask may correspond to various features that are to be configured in a particular layer (e.g., interconnects, vias, etc.) of the MOS IC device 500. Therefore, the diagram illustrated in FIG. 5 concurrently shows a number of layers of the MOS IC device 500 in an overlaid manner for ease of illustration and understanding of the disclosure.

In the example configuration of FIG. 5, the first standard cell 502a includes diffusion regions 506, 508, and 510, and the second standard cell 502b includes diffusion regions 512, 514, and 516. For example, the diffusion regions 506, 508, 510, 512, 514, and 516 may be p-type diffusion regions or n-type diffusion regions. In addition, the first standard cell 502a includes gate interconnects 518, 520, and 522. The second standard cell 502b includes gate interconnects 524, 526, and 528. The third standard cell 502c includes gate interconnects 570, 572, and 574. The fourth standard cell 502d includes gate interconnects 576, 578, and 580. In one aspect, each of the gate interconnects 518, 520, 522, 524, 526, 528, 570, 572, 574, 576, 578, and 580 may be configured in a POLY layer. In some process technologies, the gate interconnects 518, 520, 522, 524, 526, 528, 570, 572, 574, 576, 578, and 580 may be formed of metal. However, in other process technologies, the gate interconnects 518, 520, 522, 524, 526, 528, 570, 572, 574, 576, 578, and 580 may be entirely polysilicon or may be polysilicon with a metal top layer. As indicated in the top right corner of FIG. 5, the gate interconnects 518, 520, 522, 524, 526, 528, 570, 572, 574, 576, 578, and 580 extend in a first direction.

Furthermore, gate interconnects 522, 524, 574, and 576 are configured as dummy gate interconnects. A dummy gate interconnect may refer to a gate interconnect that is not configured as a transistor gate for a transistor (e.g., the fins between the dummy gate interconnects 522 and 524 and between the dummy gate interconnects 574 and 576 are cut). In addition, to electrically isolate the first standard cell 502a and the second standard cell 502b, a first double diffusion break 556a may be formed between dummy gate interconnects 522 and 524 and across the cell boundary 544a. Furthermore, to electrically isolate the third standard cell 502c and the fourth standard cell 502d, a second double diffusion break 556b may be formed between dummy gate interconnects 574 and 576 located in the third standard cell 502c, the fourth standard cell device 502d, and across the cell boundary 544b. The first double diffusion break 556a includes a first half portion of the first double diffusion break in the first standard cell 502a and a second half portion of the first double diffusion break in the second standard cell 502b. The second double diffusion break 556b includes a first half portion of the second double diffusion break in the third standard cell 502c and a second half portion of the second double diffusion break in the fourth standard cell 502d. For example, the first double diffusion break 556a and the second double diffusion break 556b may each include an isolation trench (e.g., an STI region) formed in the substrate 504 between dummy gate interconnects 522 and 524 and dummy gate interconnects 574 and 576. In an aspect, the first double diffusion break 556a and the second double diffusion break 556b may include an isolation trench that extends partially under each of the dummy gate interconnects 522 and 524 and the dummy gate interconnects 574 and 576.

In the exemplary configuration of FIG. 5, the gate interconnects 518, 520, 526, 528, 570, 572, 578, and 580 may be configured as transistor gates. For example, gate interconnect 520 is configured as transistor gate for a first transistor 554a located in the first standard cell 502a. The gate interconnect 526 is configured as a transistor gate for a second transistor 554b located in the second standard cell 502b. In addition, gate interconnect 572 may be configured as a transistor gate for a third transistor 554c located in the third standard cell 502c. Gate interconnect 578 may be configured as a transistor gate for a fourth transistor 554d located in the fourth standard cell 502d. The first transistor 554a located in the first standard cell 502a includes a first source 552a and a first drain 550a. The second transistor 554b located in the second standard cell 502b includes a second source 552b and a second drain 550b. The third transistor 554c located in the third standard cell 502c includes a third source 552c and a third drain 550c. The fourth transistor 554d located in the fourth standard cell 502d includes a fourth source 552d and a fourth drain 550d.

In an aspect, the first source 552a contacts a first CA interconnect 530 and a first via V0 538 that connect the first transistor 554a to the power rail 542. In addition, the second source 552b contacts a second CA interconnect 532 and a second via V0 540 that connect the second transistor 554b to the power rail 542. For simplicity, the CA interconnect and the via V0 of the third transistor 554c and the fourth transistor 554d are not illustrated in FIG. 5. However, it should be understood that each of the third transistor 554c and the fourth transistor 554d may include one or more CA interconnects and one or more via V0s.

In the exemplary configuration of FIG. 5, a third CA interconnect 560 and a third via V0 558 are formed over the first cell boundary 544a and the first double diffusion break 556a located between the first standard cell 502a and the second standard cell 502b. In addition, a fourth CA interconnect 566 and a fourth via V0 564 may be formed over the second cell boundary 544b and the second double diffusion break 556b located between the third standard cell 502c and the fourth standard cell 502d. The fourth via V0 564 is used to connect the fourth CA interconnect 566 located over the second double diffusion break 556b to the power rail 542. Still further, an M0 layer interconnect 562 (e.g., a metal layer or a metal oxide layer) is formed connecting the first CA interconnect 530 and the third CA interconnect 560 in parallel to the power rail 542. The M0 layer 562 may be floating such that the M0 layer 562 does not make contact with the dummy gate interconnect 522. Alternatively, the M0 layer interconnect 562 may contact and short to the dummy gate interconnect 522 by directly contacting the dummy gate interconnect or via a CB interconnect (not illustrated in FIG. 5) formed on the dummy gate interconnect 522.

By connecting the first CA interconnect 530 and the third CA interconnect 560 in parallel to the power rail 542, the parasitic resistance of the first transistor 554a may be reduced by approximately a factor of two. The parasitic resistance of the first transistor 554a may be reduced by a factor of two because of the first transistor 554a has two different electrical paths to the power rail 542 in the exemplary standard cell architecture illustrated in FIG. 5.

In addition, since the third drain 550c in the third standard cell 502c and the fourth drain 550d in the fourth standard cell 502d are adjacent to the second double diffusion break 556b, the fourth CA interconnect 566 located over the second double diffusion break 556b may not be used to reduce parasitic resistance of the third transistor 554c or the fourth transistor 554d. However, by including the fourth via V0 564, the parasitic resistance of the first transistor 554a may be further reduced because the fourth via V0 564 provides a third connection from the power rail 542 to the first transistor 554a through the fourth CA interconnect 566.

The first CA interconnect 530, the second CA interconnect 532, the third CA interconnect 560, and the fourth CA interconnect 566 each extend in a first direction as indicated in the top right corner of FIG. 5. The power rail 542 and the M0 layer interconnect 562 each extend in a second direction as indicated in the top right corner of FIG. 5.

In one aspect of the disclosure, a MOS IC includes a first standard cell (302a, 402a, 502a) and a second standard cell (302b, 402b, 502b) adjacent the first standard cell (302a, 402a, 502a). In addition, the MOS IC also includes a first MOS transistor (354a, 454a, 554a) in the first standard cell (302a, 402a, 502a). In an aspect, the first MOS transistor (354a, 454a, 554a) has a first MOS transistor source (352a, 452a, 552a). Still further, the MOS IC includes a first contact interconnect (330, 430, 530) extending in a first direction and contacting the first MOS transistor source (352a, 452a, 552a). In an aspect, the first contact interconnect (330, 430, 530) is within the first standard cell (302a, 402a, 502a). In another aspect, the first contact interconnect is coupled to a voltage source (342, 442, 542). The MOS IC additionally includes a first double diffusion break (356, 456, 556a) extending along a first boundary (344, 444, 544a) in the first direction of the first standard cell (302a, 402a, 502a) and the second standard cell (302b, 402b, 502b). In an aspect, the first double diffusion break (356, 456, 556a) is within both the first standard cell (302a, 402a, 502a) and the second standard cell (302b, 402b, 502b). The MOS IC further includes a second contact interconnect (360, 460, 560) extending in the first direction along the first boundary (344, 444, 544a) and over a portion of the first double diffusion break (356, 456, 556a). In an aspect, the second contact interconnect (360, 460, 560) is within both the first standard cell (302a, 402a, 502a) and the second standard cell (302a, 402a, 502a). Additionally, the MOS IC includes a third contact interconnect (362, 462, 562) extending in a second direction orthogonal to the first direction and contacting the first contact interconnect (330, 430, 530) and the second contact interconnect (360, 460, 560) to couple the first contact interconnect (330, 430, 530) and the second contact interconnect (360, 460, 560) together.

In another aspect, voltage from the voltage source (342, 442, 542) is provided to the first MOS transistor source (352a, 452a, 552a) through the first contact interconnect (330, 430, 530). In addition, voltage from the voltage source (342, 442, 542) is provided to the first MOS transistor source (352a, 452a, 552a) through the second contact interconnect (360, 460, 560) via the third contact interconnect (362, 462, 562).

In another aspect of the disclosure, the MOS IC includes a second MOS transistor (354b) in the second standard cell (302b). In an aspect, the second MOS transistor (354b) has a second MOS transistor source (352b). Additionally, the MOS IC includes a fourth contact interconnect (332) extending in the first direction and contacting the second MOS transistor source (352b). In an aspect, the fourth contact interconnect (332) is within the second standard cell (302b). In another aspect, the fourth contact interconnect (332) is coupled to the voltage source (342). In a further aspect, the third contact interconnect (362) further contacts the fourth contact interconnect (332) to couple the first (330), second (360), and fourth contact interconnects (332) together.

In another aspect, a voltage from the voltage source (342) is provided to the first MOS transistor source (352a) through the first contact interconnect (330). In addition, the voltage from the voltage source (342) is provided to the first MOS transistor (352a) through the second (360) and fourth contact interconnects (332) via the third contact interconnect (362). Still further, the voltage from the voltage source (342) is provided to the second MOS transistor source (352b) through the fourth contact interconnect (332). In addition, the voltage from the voltage source (342) is provided to the second MOS transistor source (352b) through the second (360) and first contact interconnects (330) via the third contact interconnect (362).

In a further aspect of the disclosure, the MOS IC includes a third standard cell (502c) adjacent the first standard cell (502a). In addition, the MOS IC includes a fourth standard cell (502d) adjacent the third standard cell (502c) and the second standard cell (502b). The MOS IC further includes a second double diffusion break (556b) extending along a second boundary (544b) in the first direction of the third standard cell (502c) and the fourth standard cell (502d). In an aspect, the second double diffusion break (556b) is within both the third standard cell (502c) and the fourth standard cell (502d). In another aspect, the first boundary (544a) and the second boundary (544b) are collinear. In yet another aspect, the first double diffusion break (556a) of the first (502a) and second standard cells (502b) and the second double diffusion break (556b) of the third (502c) and fourth standard cells (502d) are collinear. Furthermore, the MOS IC includes a fourth contact interconnect (566) extending in the first direction along the second boundary (544b) and over a portion of the second double diffusion break (556b). In an aspect, the fourth contact interconnect (566) is within both the third standard cell (502c) and the fourth standard cell (502d). The fourth contact interconnect (566) is coupled to the voltage source (542). In an aspect, the fourth contact interconnect (566) and the second contact interconnect (560) are coupled together.

In an aspect, the fourth contact interconnect (566) and the second contact interconnect (560) are formed by a same contact interconnect (560/566).

Still further, a voltage from the voltage source (542) is provided to the first MOS transistor source (552a) through the first contact interconnect (530). In addition, the voltage from the voltage source (542) is provided to the first MOS transistor source (552a) through the second contact interconnect (560) via the third contact interconnect (562). Still further, the voltage from the voltage source (542) is provided to the first MOS transistor source (552a) through the fourth contact interconnect (566) via the third contact interconnect (562).

Figure 6:
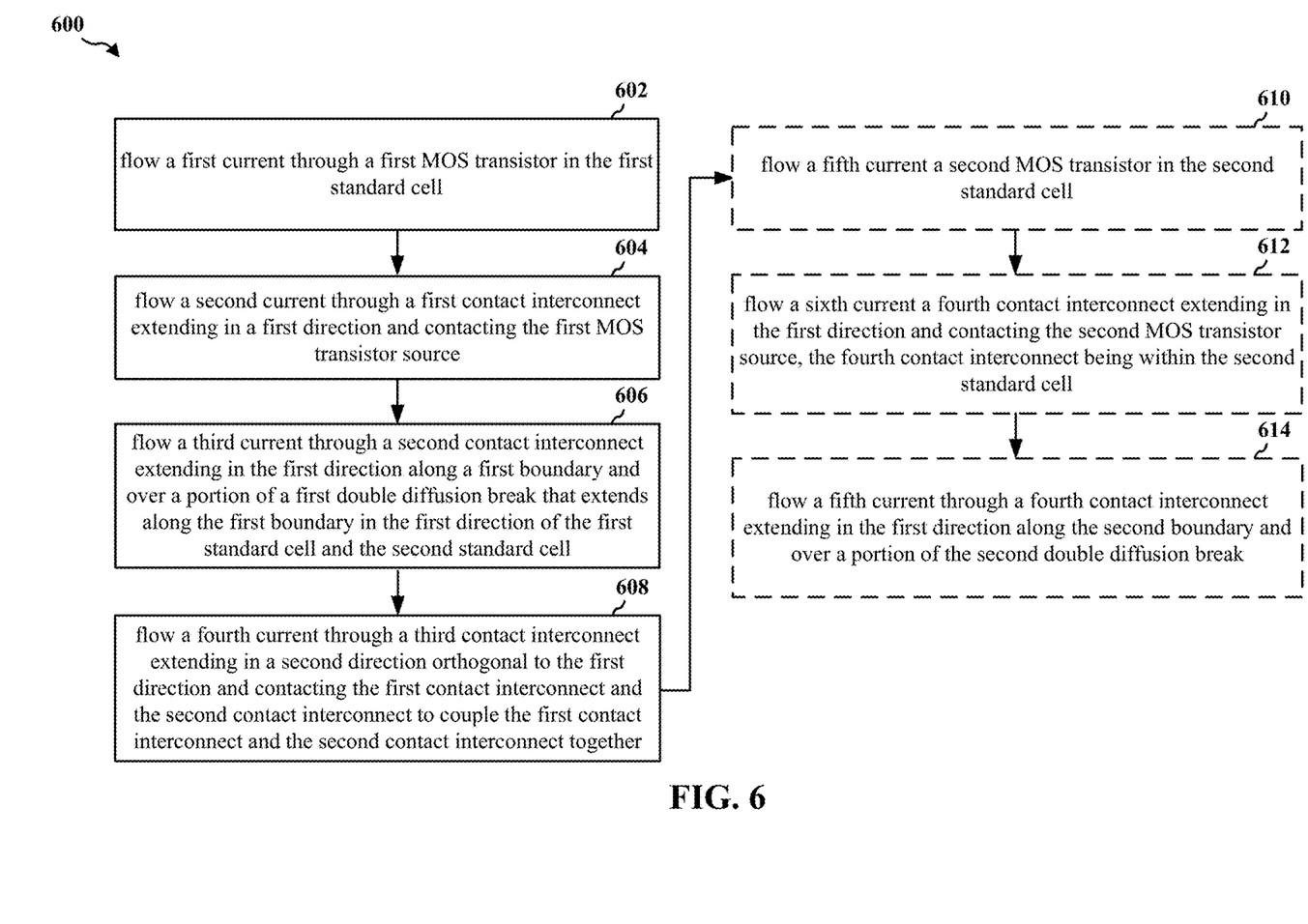
FIG. 6 is a flow chart of an exemplary method.

FIG. 6 is a flow chart 600 of an exemplary method. The exemplary method is a method of operation of a MOS IC device. Operations indicated with dashed lines represent optional operations for various aspects of the disclosure.

At 602, a first current is flowed through a first MOS transistor in the first standard cell. In an aspect, the first MOS transistor includes a first MOS transistor source. In a first example, with reference to FIG. 3A, the first standard cell may be the first standard cell 302a, the first MOS transistor may be the first transistor 354a, and the first MOS transistor source may be first source 352a. In a second example, with reference to FIG. 4A, the first standard cell may be the first standard cell 402a, the first MOS transistor may be the first transistor 454a, and the first MOS transistor source may be first source 452a. In a third example, with reference to FIG. 5, the first standard cell may be the first standard cell 502a, the first MOS transistor may be the first transistor 554a, and the first MOS transistor source may be first source 552a.

At 604, a second current is flowed through a first contact interconnect extending in a first direction and contacting the first MOS transistor source. In one aspect, the first contact interconnect may be within the first standard cell. In another aspect, the first contact interconnect may be coupled to a voltage source. In a first example, with reference to FIG. 3A, the first contact interconnect may be the first CA interconnect 330 and the voltage source may be power rail 342. In an aspect of the first example, the first CA interconnect 330 may be coupled to the power rail 342 with the first via V0 338. In a second example, with reference to FIG. 4A, the first contact interconnect may be the first CA interconnect 430 and the voltage source may be power rail 442. In an aspect of the second example, the first CA interconnect 430 may be coupled to the power rail 442 with the first via V0

438. In a third example, with reference to FIG. 5, the first contact interconnect may be the first CA interconnect 530 and the voltage source may be power rail 542. In an aspect of the third example, the first CA interconnect 530 may be coupled to the power rail 542 with the first via V0 538.

At 606, a third current is flowed through a second contact interconnect extending in the first direction along a first boundary and over a portion of a first double diffusion break that extends along the first boundary in the first direction of the first standard cell and the second standard cell. In an aspect, the first double diffusion break may be within both the first standard cell and the second standard cell. In another aspect, the second contact interconnect may be within both the first standard cell and the second standard cell. In a further aspect, the second contact interconnect may be coupled to the voltage source. In a first example, with reference to FIG. 3A, the second contact interconnect may be the third CA interconnect 360, the first cell boundary may be cell boundary 344, and the first double diffusion break may be double diffusion break 356. In an aspect of the first example, the third CA interconnect 336 may be coupled to the power rail 342 with the third via V0 358. In a second example, with reference to FIG. 4A, the second contact interconnect may be the third CA interconnect 460, the first cell boundary may be cell boundary 444, and the first double diffusion break may be double diffusion break 456. In an aspect of the second example, the third CA interconnect 436 may be coupled to the power rail 442 with the third via V0 458. In a third example, with reference to FIG. 5, the second contact interconnect may be the third CA interconnect 560, the first cell boundary may be cell boundary 544, and the first double diffusion break may be first double diffusion break 556*a*. In an aspect of the third example, the third CA interconnect 536 may be coupled to the power rail 542 with the third via V0 558.

At 608, a fourth current is flowed through a third contact interconnect extending in a second direction orthogonal to the first direction and contacting the first contact interconnect and the second contact interconnect to couple the first contact interconnect and the second contact interconnect together. In an aspect, a voltage from the voltage source may be provided to the first MOS transistor source through the first contact interconnect, and through the second contact interconnect via the third contact interconnect. In a first example, referring to FIG. 3A, the third contact interconnect may be M0 layer interconnect 362. In a second example, referring to FIG. 4A, the third contact interconnect may be M0 layer interconnect 462. In a third example, referring to FIG. 5, the third contact interconnect may be M0 layer interconnect 562.

At 610, a fifth current is flowed through a second MOS transistor in the second standard cell. In an aspect, the second MOS transistor may include a second MOS transistor source. For example, with reference to FIG. 3A, the second standard cell may be the second standard cell 302*b*, the second MOS transistor may be second transistor 354*b*, and the second MOS transistor source may be second source 352*b*.

At 612, a sixth current is flowed through a fourth contact interconnect extending in the first direction and contacting the second MOS transistor source. In an aspect, the fourth contact interconnect may be within the second standard cell. In another aspect, the fourth contact interconnect may be coupled to the voltage source. In a further aspect, the third contact interconnect may further contact the fourth contact interconnect to couple the first, second, and fourth contact interconnects together. In yet another aspect, a voltage from the voltage source may be provided to the first MOS transistor source through the first contact interconnect, and through the second and fourth contact interconnects via the third contact interconnect, and is provided to the second MOS transistor source through the fourth contact interconnect, and through the second and first contact interconnects via the third contact interconnect. For example, with reference to FIG. 3A, the fourth contact interconnect may be second CA interconnect 332 and coupled to the power rail 342 with the second via V0 340.

At 614, a fifth current is flowed through a fourth contact interconnect extending in the first direction along the second boundary and over a portion of a second double diffusion break. In an aspect, the fourth contact interconnect may be within both a third standard cell and a fourth standard cell. In another aspect, the fourth contact interconnect may be coupled to the voltage source. In a further aspect, the third standard cell may be adjacent to the first standard cell, the fourth standard cell may be adjacent to the third standard cell and the second standard cell, the second double diffusion break may extend along a second boundary in the first direction of the third standard cell and the fourth standard cell, the second double diffusion break may be within both the third standard cell and the fourth standard cell. In an aspect, the first boundary and the second boundary may be collinear. In another aspect, the first double diffusion break of the first and second standard cells and the second double diffusion break of the third and fourth standard cells may be collinear. Still further, the fourth contact interconnect and the second contact interconnect may be coupled together. Further still, the fourth contact interconnect and the second contact interconnect may be formed by a same contact interconnect. In yet another aspect, a voltage from the voltage source is provided to the first MOS transistor source through the first contact interconnect, through the second contact interconnect via the third contact interconnect, and through the fourth contact interconnect via the third contact interconnect. For example, with reference to FIG. 5, the third standard cell may be third standard cell 502*c*, the fourth standard cell may be fourth standard cell 502*d*, the second boundary may be second cell boundary 544*b*, the second double diffusion break may be second double diffusion break 556*b*, and the fourth contact interconnect may be third CA interconnect 560 located over the second double diffusion break 556*b*. In an aspect, the third CA interconnect 560 may be coupled to the power rail 542 with fourth via V0 564.

The MOS IC further includes first means for flowing the current in a first direction and contacting a first MOS transistor source of a first MOS transistor in the first standard cell. In a first example, with reference to FIG. 3A, the first means may be the first CA interconnect 330. In a second example, with reference to FIG. 4A, the first means may be the first CA interconnect 430. In a third example, with reference to FIG. 5, the first means may be the first CA interconnect 530.

The MOS IC further includes second means for flowing the current in the first direction along a first boundary and over a portion of a first double diffusion break that extends along the first boundary in the first direction of the first standard cell and the second standard cell. In a first example, referring to FIG. 3A, the second means may be third CA interconnect 360. In a second example, referring to FIG. 4A, the second means may be third CA interconnect 460. In a third example, referring to FIG. 5, the second means may be third CA interconnect 560.

The MOS IC also includes third means for flowing the current in a second direction orthogonal to the first direction and contacting the first means and the second means to couple the first means and the second means together. In a first example, referring to FIG. 3A, the third means may be M0 layer interconnect 362. In a second example, referring to FIG. 4A, the third means may be M0 layer interconnect 462. In a third example, referring to FIG. 5, the third means may be M0 layer interconnect 562.

The MOS IC further includes fourth means for flowing the current in the first direction and contacting a second MOS transistor source of a second MOS transistor in a second standard cell. In an aspect, the fourth means may be within the second standard cell. In another aspect the fourth means may be coupled to the voltage source. For example, with reference to FIG. 3A, the fourth means may be second CA interconnect 332.

The MOS IC also includes fourth means for flowing in the first direction along the second boundary and over a portion of the second double diffusion break. In an aspect the fourth means may be within both the third standard cell and the fourth standard cell. In another aspect the fourth means may be coupled to the voltage source. For example, with reference to FIG. 5, the fourth means may be fourth CA interconnect 566 located over the second double diffusion break 556b.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A metal oxide semiconductor (MOS) integrated circuit (IC) including a first standard cell and a second standard cell adjacent the first standard cell, the MOS IC comprising:
    a first MOS transistor in the first standard cell, the first MOS transistor having a first MOS transistor source;
    a first contact interconnect extending in a first direction and contacting the first MOS transistor source, the first contact interconnect being within the first standard cell, the first contact interconnect being coupled to a voltage source;
    a first double diffusion break extending along a first boundary in the first direction of the first standard cell and the second standard cell, the first double diffusion break being within both the first standard cell and the second standard cell;
    a second contact interconnect extending in the first direction along the first boundary and over a portion of the first double diffusion break, the second contact interconnect being within both the first standard cell and the second standard cell, the second contact interconnect being coupled to the voltage source; and
    a third contact interconnect extending in a second direction orthogonal to the first direction and contacting the first contact interconnect and the second contact interconnect to couple the first contact interconnect and the second contact interconnect together.

2. The MOS IC of claim 1, wherein a voltage from the voltage source is provided to the first MOS transistor source through the first contact interconnect, and through the second contact interconnect via the third contact interconnect.

3. The MOS IC of claim 1, further comprising:
    a second MOS transistor in the second standard cell, the second MOS transistor having a second MOS transistor source; and
    a fourth contact interconnect extending in the first direction and contacting the second MOS transistor source, the fourth contact interconnect being within the second standard cell, the fourth contact interconnect being coupled to the voltage source,
    wherein the third contact interconnect further contacts the fourth contact interconnect to couple the first, second, and fourth contact interconnects together.

4. The MOS IC of claim 3, wherein a voltage from the voltage source is provided to the first MOS transistor source through the first contact interconnect, and through the second and fourth contact interconnects via the third contact interconnect, and is provided to the second MOS transistor source through the fourth contact interconnect, and through the second and first contact interconnects via the third contact interconnect.

5. The MOS IC of claim 1, wherein the MOS IC further includes a third standard cell adjacent the first standard cell, and a fourth standard cell adjacent the third standard cell and the second standard cell, the MOS IC further comprising:
    a second double diffusion break extending along a second boundary in the first direction of the third standard cell and the fourth standard cell, the second double diffusion break being within both the third standard cell and the fourth standard cell, the first boundary and the second boundary being collinear, the first double diffusion break of the first and second standard cells and the second double diffusion break of the third and fourth standard cells being collinear; and
    a fourth contact interconnect extending in the first direction along the second boundary and over a portion of the second double diffusion break, the fourth contact interconnect being within both the third standard cell and the fourth standard cell, the fourth contact interconnect being coupled to the voltage source,
wherein the fourth contact interconnect and the second contact interconnect are coupled together.

6. The MOS IC of claim 5, wherein the fourth contact interconnect and the second contact interconnect are formed by a same contact interconnect.

7. The MOS IC of claim 5, wherein a voltage from the voltage source is provided to the first MOS transistor source through the first contact interconnect, through the second contact interconnect via the third contact interconnect, and through the fourth contact interconnect via the third contact interconnect.

8. A method of operation of a metal oxide semiconductor (MOS) integrated circuit (IC) including a first standard cell and a second standard cell adjacent the first standard cell, the method comprising:
flowing a first current through a first MOS transistor in the first standard cell, the first MOS transistor having a first MOS transistor source;
flowing a second current through a first contact interconnect extending in a first direction and contacting the first MOS transistor source, the first contact interconnect being within the first standard cell, the first contact interconnect being coupled to a voltage source;
flowing a third current through a second contact interconnect extending in the first direction along a first boundary and over a portion of a first double diffusion break that extends along the first boundary in the first direction of the first standard cell and the second standard cell, the first double diffusion break being within both the first standard cell and the second standard cell, the second contact interconnect being within both the first standard cell and the second standard cell, the second contact interconnect being coupled to the voltage source; and
flowing a fourth current through a third contact interconnect extending in a second direction orthogonal to the first direction and contacting the first contact interconnect and the second contact interconnect to couple the first contact interconnect and the second contact interconnect together.

9. The method of claim 8, wherein a voltage from the voltage source is provided to the first MOS transistor source through the first contact interconnect, and through the second contact interconnect via the third contact interconnect.

10. The method of claim 8, further comprising:
flowing a fifth current through a second MOS transistor in the second standard cell, the second MOS transistor having a second MOS transistor source; and
flowing a sixth current through a fourth contact interconnect extending in the first direction and contacting the second MOS transistor source, the fourth contact interconnect being within the second standard cell, the fourth contact interconnect being coupled to the voltage source,
wherein the third contact interconnect further contacts the fourth contact interconnect to couple the first, second, and fourth contact interconnects together.

11. The method of claim 10, wherein a voltage from the voltage source is provided to the first MOS transistor source through the first contact interconnect, and through the second and fourth contact interconnects via the third contact interconnect, and is provided to the second MOS transistor source through the fourth contact interconnect, and through the second and first contact interconnects via the third contact interconnect.

12. The method of claim 8, wherein the MOS IC further includes a third standard cell adjacent the first standard cell, a fourth standard cell adjacent the third standard cell and the second standard cell, a second double diffusion break extending along a second boundary in the first direction of the third standard cell and the fourth standard cell, the second double diffusion break being within both the third standard cell and the fourth standard cell, the first boundary and the second boundary being collinear, the first double diffusion break of the first and second standard cells and the second double diffusion break of the third and fourth standard cells being collinear, the method further comprising:
flowing a fifth current through a fourth contact interconnect extending in the first direction along the second boundary and over a portion of the second double diffusion break, the fourth contact interconnect being within both the third standard cell and the fourth standard cell, the fourth contact interconnect being coupled to the voltage source,
wherein the fourth contact interconnect and the second contact interconnect are coupled together.

13. The method of claim 12, wherein the fourth contact interconnect and the second contact interconnect are formed by a same contact interconnect.

14. The method of claim 12, wherein a voltage from the voltage source is provided to the first MOS transistor source through the first contact interconnect, through the second contact interconnect via the third contact interconnect, and through the fourth contact interconnect via the third contact interconnect.

15. A metal oxide semiconductor (MOS) integrated circuit (IC) including a first standard cell and a second standard cell adjacent the first standard cell, the MOS IC comprising:
first means for flowing a current in a first direction, the first means contacting a first MOS transistor source of a first MOS transistor in the first standard cell, the first means being within the first standard cell, the first means being coupled to a voltage source;
second means for flowing the current in the first direction along a first boundary and over a portion of a first double diffusion break that extends along the first boundary in the first direction of the first standard cell and the second standard cell, the first double diffusion break being within both the first standard cell and the second standard cell, the second means being within both the first standard cell and the second standard cell, the second means being coupled to the voltage source; and
third means for flowing the current in a second direction orthogonal to the first direction and contacting the first means and the second means to couple the first means and the second means together.

16. The MOS IC of claim 15, wherein a voltage from the voltage source is provided to the first MOS transistor source through the first means, and through the second means via the third means.

17. The MOS IC of claim 15, further comprising:
fourth means for flowing the current in the first direction and contacting a second MOS transistor source of a second MOS transistor in the second standard cell, the fourth means being within the second standard cell, the fourth means being coupled to the voltage source,
wherein the third means further contacts the fourth means to couple the first, second, and fourth means together.

18. The MOS IC of claim 17, wherein a voltage from the voltage source is provided to the first MOS transistor source through the first means, and through the second and fourth means via the third means, and is provided to the second MOS transistor source through the fourth means, and through the second and first means via the third means.

19. The MOS IC of claim 15, wherein the MOS IC further includes a third standard cell adjacent the first standard cell, a fourth standard cell adjacent the third standard cell and the second standard cell, a second double diffusion break extending along a second boundary in the first direction of the third standard cell and the fourth standard cell, the second double diffusion break being within both the third standard cell and the fourth standard cell, the first boundary and the second boundary being collinear, the first double diffusion break of the first and second standard cells and the second double diffusion break of the third and fourth standard cells being collinear, the MOS IC further comprising:

fourth means for flowing the current in the first direction along the second boundary and over a portion of the second double diffusion break, the fourth means being within both the third standard cell and the fourth standard cell, the fourth means being coupled to the voltage source, wherein the fourth means and the second means are coupled together.

20. The MOS IC of claim 19, wherein the fourth means and the second means are formed by a same means, and wherein a voltage from the voltage source is provided to the first MOS transistor source through the first means, through the second means via the third means, and through the fourth means via the third means.

* * * * *